(12) United States Patent
Jeong et al.

(10) Patent No.: US 7,300,888 B2
(45) Date of Patent: Nov. 27, 2007

(54) METHODS OF MANUFACTURING INTEGRATED CIRCUIT DEVICES HAVING AN ENCAPSULATED INSULATION LAYER

(75) Inventors: Hong-sik Jeong, Kyungki-do (KR); Soo-ho Shin, Seoul (KR); Won-suk Yang, Kyungki-do (KR); Ki-nam Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/008,700

(22) Filed: Dec. 7, 2001

(65) Prior Publication Data

US 2002/0072250 A1 Jun. 13, 2002

(30) Foreign Application Priority Data

Dec. 7, 2000 (KR) ................. 2000-74315

(51) Int. Cl.
*H01L 21/31* (2006.01)
*H01L 21/469* (2006.01)
*H01L 21/3205* (2006.01)
*H01L 21/4763* (2006.01)
*H01L 21/336* (2006.01)

(52) U.S. Cl. ............... 438/764; 438/595; 438/782; 438/257

(58) Field of Classification Search ............... 438/256, 438/279, 399, 586, 597, 598, 599, 602, 624, 438/634, 639, 761, 767, 593, 343, 366, 778, 438/764, 595, 782, 787, 257
See application file for complete search history.

(56) References Cited

U.S. PATENT DOCUMENTS

| | | | | |
|---|---|---|---|---|
| 4,996,167 A | * | 2/1991 | Chen | 438/279 |
| 5,072,282 A | * | 12/1991 | Takagi et al. | 257/764 |
| 5,401,681 A | * | 3/1995 | Dennison | 438/253 |
| 5,549,786 A | * | 8/1996 | Jones et al. | 438/723 |
| 6,013,569 A | * | 1/2000 | Lur et al. | 438/595 |
| 6,078,073 A | * | 6/2000 | Habu et al. | 257/296 |
| 6,489,230 B1 | * | 12/2002 | Huang | 438/624 |
| 6,548,357 B2 | * | 4/2003 | Weybright et al. | 438/279 |
| 6,815,762 B2 | * | 11/2004 | Yoshida et al. | 257/323 |

* cited by examiner

*Primary Examiner*—Chuong A. Luu
(74) *Attorney, Agent, or Firm*—Myers Bigel Sibley & Sajovec, PA

(57) ABSTRACT

An integrated circuit device is manufactured by forming an insulating layer on a substrate. A capping layer is formed on the insulating layer and both the capping layer and the insulating layer are patterned. Insulating spacers are formed on sidewalls of the insulating layer so that the insulating spacers, the capping layer, and the substrate enclose the insulating layer.

17 Claims, 8 Drawing Sheets

METHODS OF MANUFACTURING INTEGRATED CIRCUIT DEVICES HAVING AN ENCAPSULATED INSULATION LAYER

RELATED APPLICATION

This application claims the benefit of Korean Patent Application No. 2000-74315, filed Dec. 7, 2000, the disclosure of which is hereby incorporated herein by reference.

FIELD OF THE INVENTION

The present invention relates generally to integrated circuit devices and manufacturing methods therefor and, more particularly, to insulation layers that may be used to fill gaps between conductive layers and manufacturing methods therefor.

BACKGROUND OF THE INVENTION

With the development of very large scale integrated (VLSI) circuits, the integration density of semiconductor devices may increase and design rules may decrease. As a result, the distance between adjacent conductive layers at the same level may decrease, which can increase aspect ratios in gaps between conductive layers.

Various technologies for filling a high aspect ratio gap between conductive layers with an insulating material have been developed. Boro-phospho-silicate glass (BPSG) and high density plasma (HDP) oxide are insulating materials that have generally good gap filling properties. Because the formation of BPSG layers typically involves the performance of a reflow process at a temperature of approximately 800° C. or higher, it generally is not used in products having a design rule of 0.15 μm or less due to short channel effects of transistors. Furthermore, because HDP oxide is generally less effective in filling gaps, it typically is not used in products having a design rule of 0.1 μm or less.

To overcome the above problems, spin on glass (SOG) may be used as a gap filling material. Because SOG is deposited in a liquid state, it may be used to fill high aspect ratio gaps between conductive layers in an effective manner. Also, because SOG has a relatively low dielectric constant and may reduce conductive coupling between adjacent conductive layers, it may be used to further increase the integration density of semiconductor devices.

While SOG liquids have generally good gap filling abilities, they are routinely densified through a curing process. During curing, a SOG layer may not be sufficiently cured at points near other layers. During a subsequent wet cleaning process, an SOG layer that is not sufficiently cured may deform due to water absorption from the cleaning solution. Furthermore, the portion of the SOG layer that is not sufficiently cured may be more readily removed due to a relatively high etch rate, which may result in profile defects. For example, in a worst case scenario, an entire SOG layer may be removed, thereby eliminating an interlayer dielectric film. Also, during subsequent thermal processing, outgassing may occur, thereby removing water from the SOG layer. This may cause, for example, via poisoning stemming from oxidation of an exposed metal wiring layer. Even if a SOG layer is successfully cured, because the etch rate of the SOG layer may be relatively high compared to other oxide layers, more serious problems may occur as a design rule decreases.

SUMMARY OF THE INVENTION

According to embodiments of the present invention, an integrated circuit device is manufactured by forming an insulating layer on a substrate. A capping layer is formed on the insulating layer and both the capping layer and the insulating layer are patterned. Insulating spacers are formed on sidewalls of the insulating layer so that the insulating spacers, the capping layer, and the substrate enclose the insulating layer. The capping layer and the insulating spacers comprise a protective layer that may inhibit water absorption by the insulating layer and reduce the risk of profile deformation in the insulating layer. Furthermore, the protective layer may reduce outgassing from the insulating layer, which may result in via poisoning due to oxidation of a metal wiring layer.

In other embodiments, the insulating layer is a spin on glass layer and the capping layer comprises silicon oxide, silicon nitride, undoped polysilicon, doped polysilicon, and/or $Al_2O_3$. In still other embodiments, each of the insulating spacers has a width in a range of about 50 Å to about 200 Å.

In still other embodiments, the insulating spacers are formed by forming a second insulating layer on the capping layer, the sidewalls of the first insulating layer, and the substrate. The second insulating layer is then etched so as to expose the substrate and the capping layer.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1A:
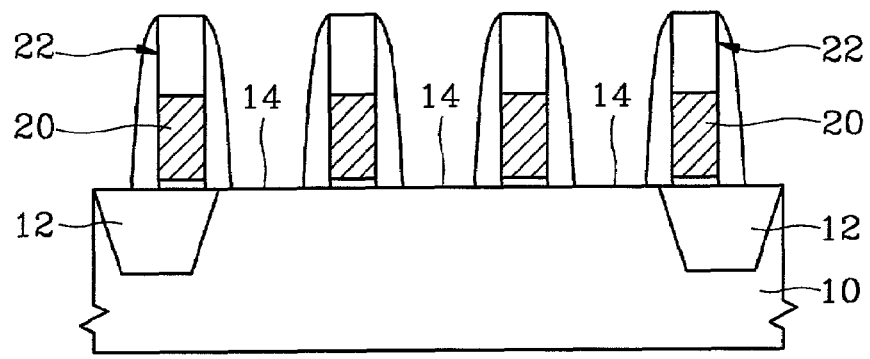
FIGS. 1-9 are cross sectional views that illustrate integrated circuit devices having encapsulated insulation layers and methods of manufacturing same in accordance with embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present. In the drawings, FIGS. 1A through 9A are cross-sectional views when viewed from a direction parallel to a direction in which an active region of a semiconductor substrate used, for example, in manufacturing a DRAM extends. FIGS. 1B through 9B are cross-sectional views when viewed from a direction perpendicular to the direction in which the active region extends.

Figure 1B:
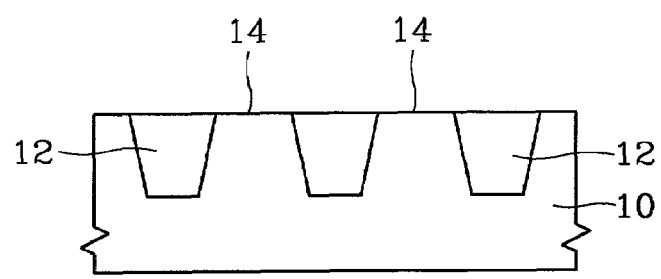

Referring to FIGS. 1A and 1B, a plurality of conductive patterns 20 covered with a first insulating layer 22, such as a silicon nitride layer, are formed on a semiconductor substrate 10 in which an active region is defined by an isolation region 12. In accordance with embodiments of the present invention, the conductive patterns 20 may comprise a plurality of gate electrodes. A contact region 14 positioned on the active region of the semiconductor substrate 10 is exposed between each of the plurality of gate electrodes 20. First insulating layers 22 overly the gate electrodes 20.

Figure 2A:
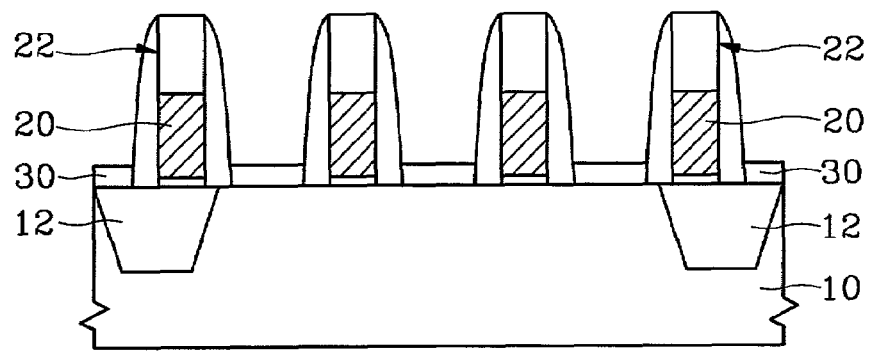
Figure 2B:
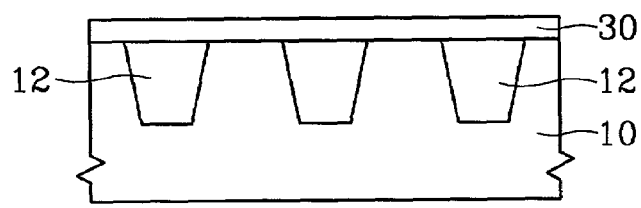

Referring to FIGS. 2A and 2B, a second insulating layer 30 is formed to a thickness of about 10 Å-300 Å on the surface of the semiconductor substrate 10 exposed between the gate electrodes 20. The second insulating layer 30 may function as an etch stop layer during subsequent processing. The second insulating layer 30 may comprise silicon nitride, silicon oxide, and/or aluminum oxide ($Al_2O_3$), in accordance with embodiments of the present invention. In preferred embodiments of the present invention, the second insulating layer comprises silicon nitride. In other embodiments of the present invention, the second insulating layer 30 may be omitted.

Figure 3A:
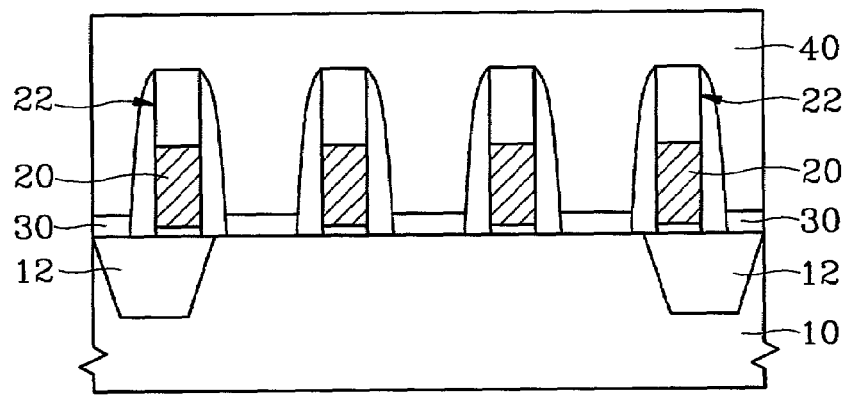
Figure 3B:
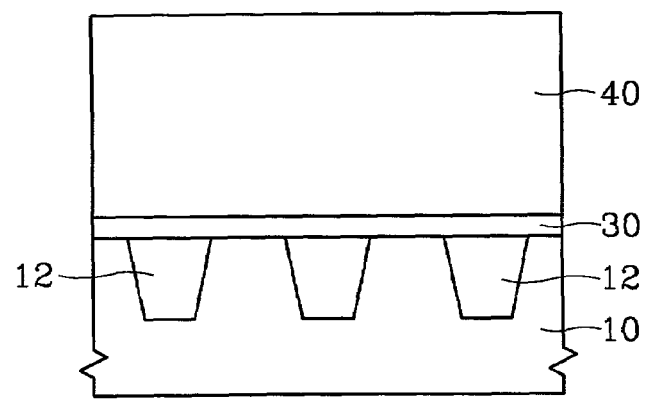

Referring to FIGS. 3A and 3B, spin-on-glass (SOG) is deposited on the first and second insulating layers 22 and 30, thereby filling a space between the gate electrodes 20. Curing is then performed on the SOG to form a planarized SOG layer 40.

Figure 4A:
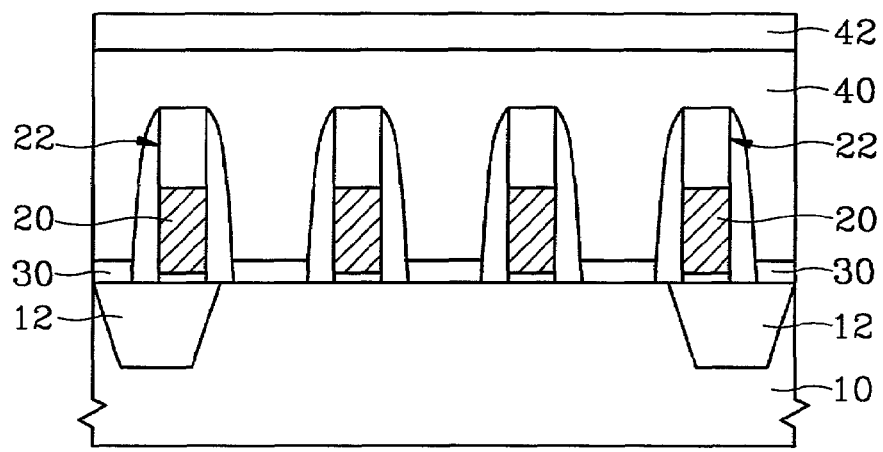
Figure 4B:
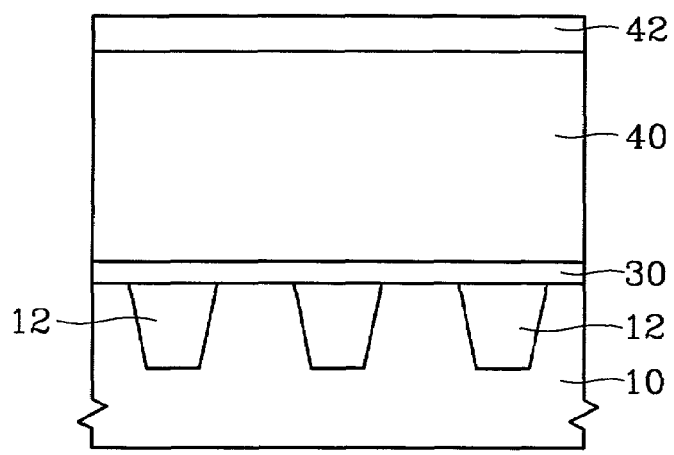

Referring to FIGS. 4A and 4B, a capping layer 42 is formed on the SOG layer 40. The capping layer 42, which may be removed during subsequent processing, may comprise an insulating material or a conductive material, and may be used to protect the SOG layer 40. In accordance with embodiments of the present invention, the capping layer 42 may comprise silicon oxide, silicon nitride, undoped polysilicon, doped polysilicon, and/or $Al_2O_3$.

Figure 5A:
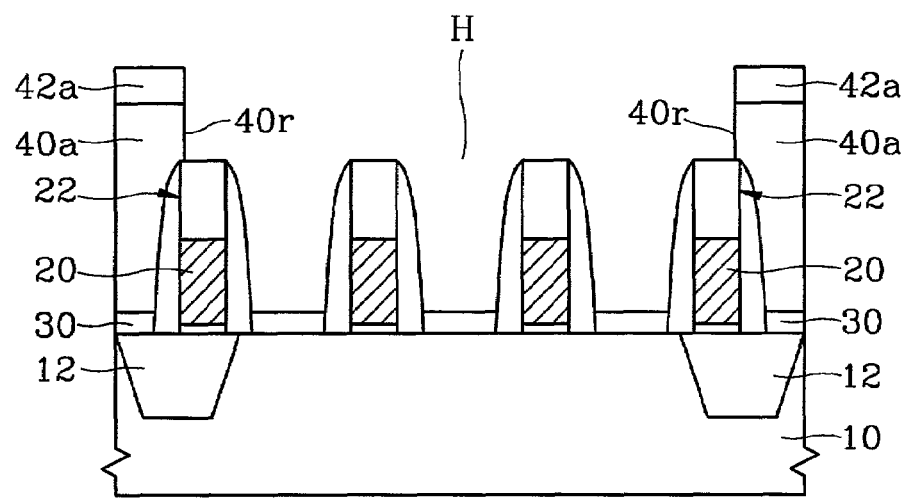
Figure 5B:
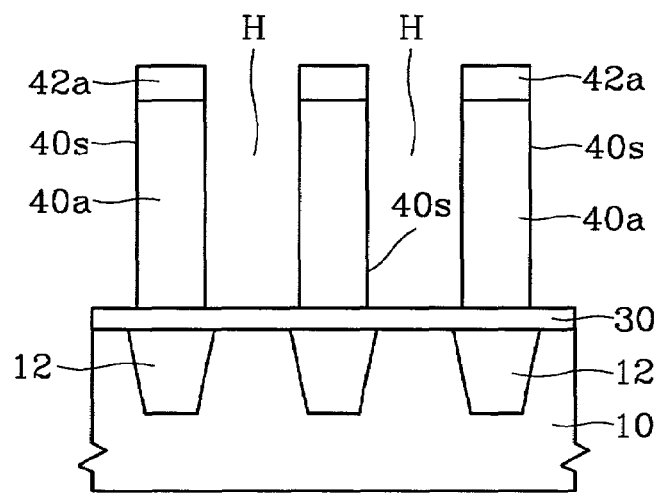

Referring to FIGS. 5A and 5B, the capping layer 42 and the SOG layer 40 are patterned by photolithography using a photoresist pattern (not shown) to form a SOG pattern 40a that exposes the first and second insulating layers 22 and 30 and a capping pattern 42a that overlies the SOG pattern 40a. If the second insulating layer 30 is omitted, then the contact region 14 of the semiconductor substrate 10 and the top of the first insulating layer 22 are exposed by an opening H formed through the capping pattern 42a and the SOG pattern 40a. The SOG pattern 40a has a first sidewall 40r that extends vertically from the top of the first insulating layer 22 and a second sidewall 40s that extends vertically from the surface of semiconductor substrate 10. Conventional ashing and strip processes may then be performed to remove the photoresist pattern. Sulfuric acid may be used in a strip process, which generally does not adversely impact the profile of the SOG pattern 40a.

Figure 6A:
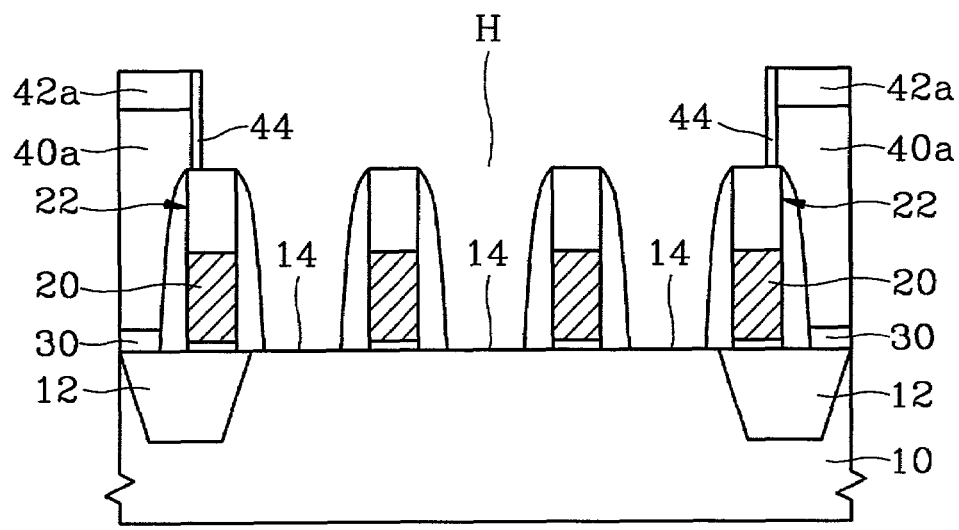
Figure 6B:
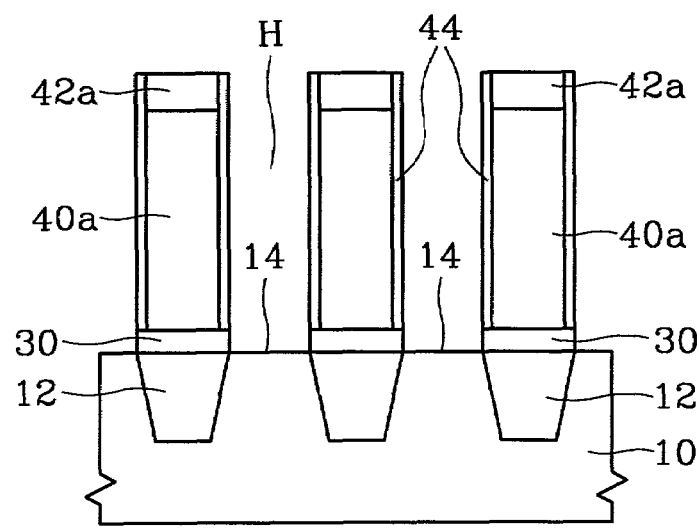

Referring to FIGS. 6A and 6B, insulating spacers 44 overlying the first and second sidewalls 40r and 40s of the SOG pattern 40a are formed on the first and second insulating layers 22 and 30, respectively. The width of each of the insulating spacers 44 may be about 50 Å-500 Å. In accordance with some embodiments of the present invention, each of the insulating spacers 44 has a width of about 50 Å-200 Å. The insulating spacers 44 may be formed by first forming a third insulating layer on the resulting structure in which the SOG pattern 40a and the capping pattern 42a have been formed. The third insulating layer may comprise silicon oxide, silicon nitride, undoped polysilicon, and/or $Al_2O_3$. The third insulating layer is then etched to leave insulating spacers 44 covering the first and second sidewalls 40r and 40s of the SOG pattern 40a and the sidewall of the capping pattern 42a on the first and second insulating layers 22 and 30. In embodiments of the present invention in which the first insulating layer 22 comprises silicon nitride, the third insulating layer may comprise silicon oxide to allow the third insulating layer to be selectively etched with respect to the silicon nitride layer during etchback of the third insulating layer, which may minimize loss of the first insulating layer 22.

As a result, the SOG pattern 40a is surrounded by a protective layer, which comprises the capping pattern 42a overlying the top of the SOG pattern 40a, the insulating spacers 44 overlying the first and second sidewalls 40r and 40s, and the first and second insulating layers 22 and 30. Together, the protective layer and the SOG pattern 40a may comprise an interlayer dielectric pattern. If the second insulating layer 30 is omitted, then the bottom of the SOG pattern 40a is surrounded by the semiconductor substrate 10 instead of the second insulating layer 30.

The second insulating layer 30 may serve as an etch stop layer during etchback of the third insulating layer. Thus, the insulating spacers 44 are formed after the etchback is complete while a portion of the second insulating layer 30 exposed by the opening H is substantially removed to expose the contact region 14 of the semiconductor substrate 10. The top of the first insulating layer 22, which is exposed by the opening H, may also be partially consumed. The thickness of the first insulating layer 22 may be adjusted based on the amount of material typically consumed during etchback of the third insulating layer.

Figure 7A:
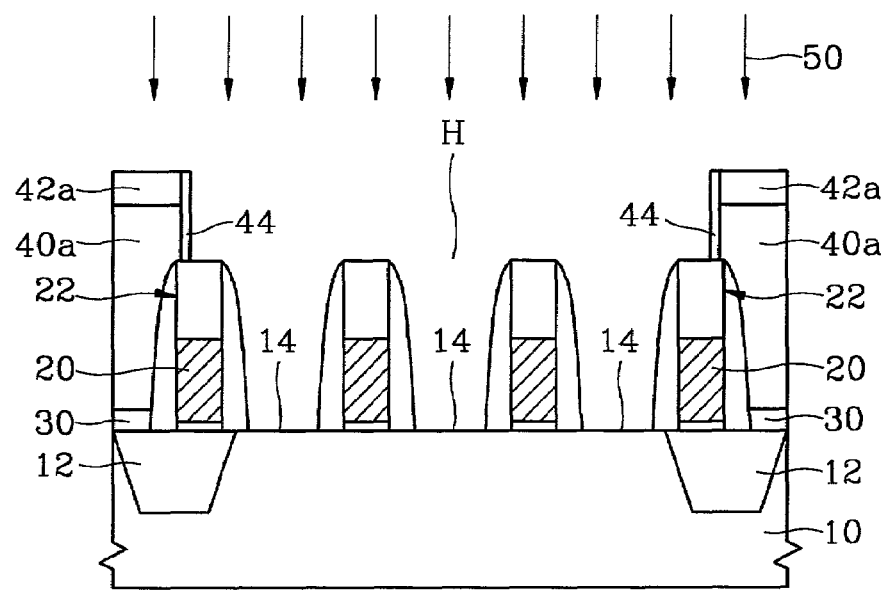
Figure 7B:
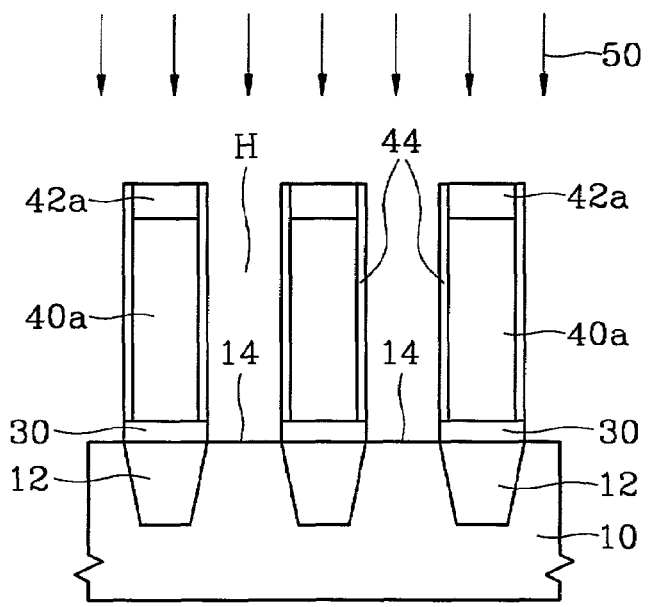

Referring to FIGS. 7A and 7B, a native oxide layer is removed from the contact region 14 by, for example, wet cleaning using a cleaning solution 50 or dry cleaning. If wet cleaning is used, then the cleaning solution 50 may comprise, for example, hydrofluoric acid (HF) or a standard solution (SC)-1 comprising a mixture of $NH_4OH$, $H_2O_2$, and $H_2O$. In accordance with embodiments of the present invention, the SOG pattern 40a is surrounded by the protective layer, which comprises the capping pattern 42a overlying the top of the SOG pattern 40a, the insulating spacers 44 overlying the first and second sidewalls 40r and 40s, and the first and second insulating layers 22 and 30. Thus, if the SOG pattern 40a is not completely cured, then the protective layer may inhibit water absorption from the cleaning solution 50 and reduce the risk of profile deformation in the SOG pattern 40a and interlayer dielectric patterns comprising the same.

Figure 8A:
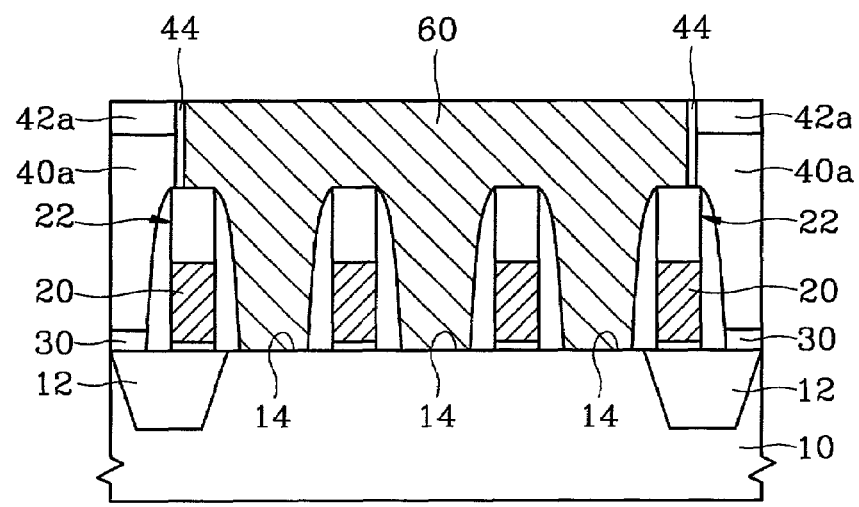
Figure 8B:
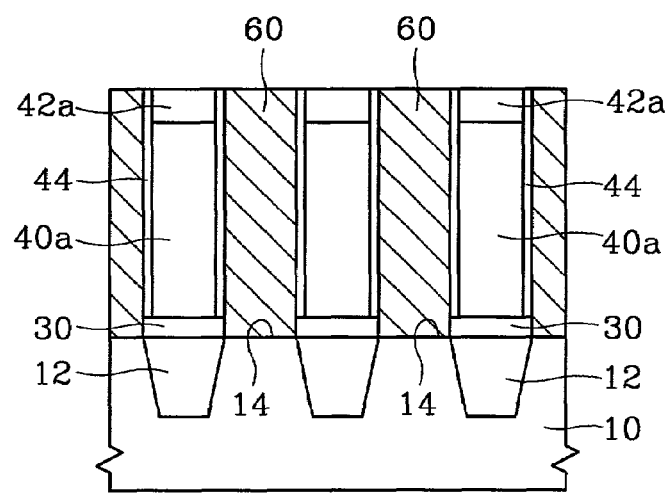

Referring to FIGS. 8A and 8B, after removing the native oxide layer from the contact region 14, a conductive material, such as a doped polysilicon, is deposited on the resulting structure to fill the opening H with a conductive layer 60. Because the SOG pattern 40a is surrounded by the protective layer comprising the capping pattern 42a, the insulating spacers 44, and the first and second insulating layers 22 and 30, outgassing from the SOG pattern 40a, which may adversely impact the conductive layer 60, may be reduced.

Figure 9A:
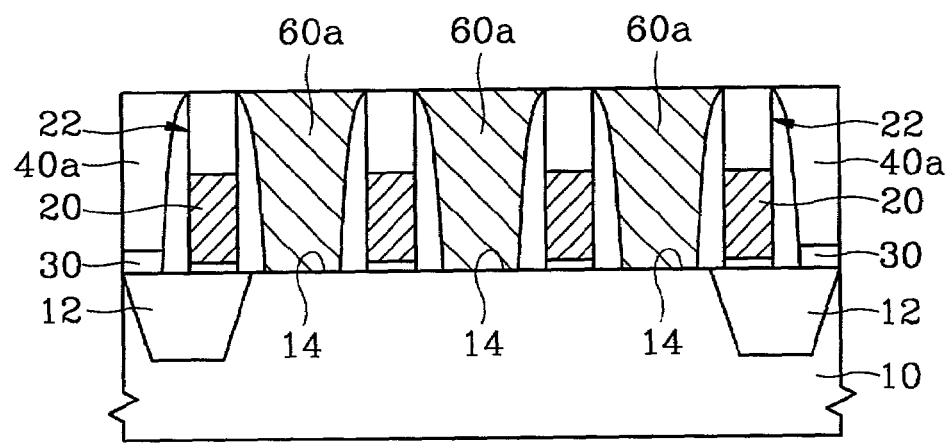
Figure 9B:
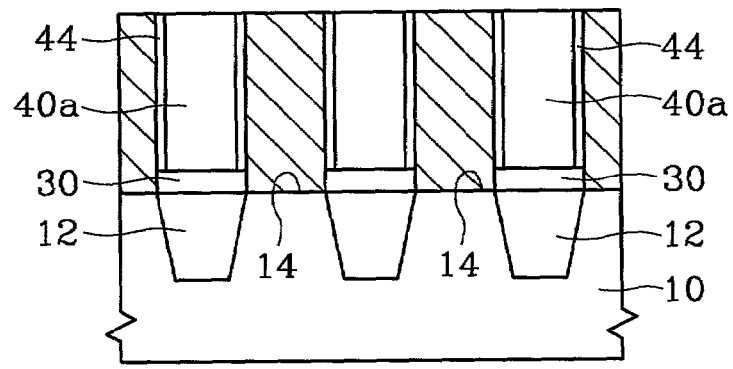

Referring to FIGS. 9A and 9B, chemical mechanical polishing (CMP) is performed on the resulting structure in which the conductive layer 60 has been formed until the first insulating layer 22 is exposed. As a result, a portion of the conductive layer 60 is removed to thereby form a contact pad 60a, which is self aligned by the gate electrode 20 and contacts the contact region 14. As part of the CMP operation, the capping pattern 42a and portions of the SOG pattern 40a and the insulating spacers 44 are removed, and the SOG pattern 40a is exposed on the polished surface. The contact pad 60a may not suffer from via poisoning caused by the SOG pattern 40a because an interlayer dielectric pattern that comprises the SOG pattern 40a is surrounded by the protective layer, which may inhibit outgassing from the SOG pattern 40a.

From the foregoing it can readily be seen that, in accordance with embodiments of the present invention, an interlayer dielectric film may be formed that comprises a SOG layer that is surrounded by a protective layer. A high-density semiconductor device may be manufactured in which a contact pad is self-aligned to an underlying conductive pattern using the interlayer dielectric film comprising the SOG layer and the protective layer. During a wet cleaning step performed before forming the contact pad, but after having formed the interlayer dielectric film, water absorption and profile deformation, which may adversely affect the SOG layer, may be reduced. Moreover, the protective layer of the interlayer dielectric film may reduce outgassing from the SOG layer, which may reduce the possibility of via poisoning resulting from oxidation on the contact pad.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A method of manufacturing an integrated circuit device, comprising:
   forming a pattern comprising a pair of mesa regions on a substrate;
   forming a first insulating layer on the pair of mesa regions;
   forming a second insulating layer on the pair of mesa regions and the substrate;
   forming a capping layer on the second insulating layer;
   patterning the capping layer and the second insulating layer together, such that parts of the first insulating layer that were covered by the second insulating layer are exposed without exposing the mesa regions under the first insulating layer;
   forming insulating spacers on sidewalls of the second insulating layer such that the second insulating layer is enclosed by the insulating spacers, the capping layer, the first insulating layer, and the substrate;
   forming a conductive layer on the pair of mesa regions and the substrate so as to fill a contact region between the pair of mesa regions and to cover the mesa regions; and
   removing a portion of the conductive layer such that an upper surface of the first insulating layer, opposite the substrate, is exposed.

2. The method of claim 1, wherein the second insulating layer is a spin on glass layer.

3. The method of claim 1, further comprising:
   applying a cleaning solution to the integrated circuit device so as to expose a contact region between the pair of mesa regions by removing at least a portion of a native oxide layer from the contact region.

4. The method of claim 3, wherein the cleaning solution comprises at least one of hydrofluoric (HF) acid or a mixture of $NH_4OH$, $H_2O_2$, and $H_2O$.

5. The method of claim 1, wherein removing the portion of the conductive layer comprises:
   chemical mechanical polishing the conductive layer such that the upper surface of the first insulating layer, opposite the substrate, is exposed.

6. The method of claim 1, wherein the capping layer may comprise at least one of silicon oxide, silicon nitride, undoped polysilicon, doped polysilicon, or $Al_2O_3$.

7. The method of claim 1, wherein forming the insulating spacers comprises:
   forming a third insulating layer on the capping layer, the sidewalls of the second insulating layer, and the substrate; and
   etching the third insulating layer so as to remove at least a portion of the third insulating layer from the substrate and an upper surface of the capping layer, opposite the substrate.

8. The method of claim 1, wherein each of the insulating spacers has a width in a range of about 50 Å to about 200 Å.

9. A method of manufacturing an integrated circuit device, comprising:
   forming a pattern comprising a pair of mesa regions on a substrate;
   forming a first insulating layer on the pair of mesa regions;
   forming an etch stop layer on the substrate;
   forming a second insulating layer on the pair of mesa regions and the etch stop layer;
   forming a capping layer on the second insulating layer;
   patterning the capping layer and the second insulating layer together, such that parts of the first insulating layer that were covered by the second insulating layer are exposed without exposing the mesa regions under the first insulating layer; and
   forming insulating spacers on sidewalls of the second insulating layer such that the second insulating layer is enclosed by the insulating spacers, the capping layer, the first insulating layer, and the etch stop layer;
   forming a conductive layer on the pair of mesa regions and the substrate so as to fill a contact region and to cover the mesa regions; and
   removing a portion of the conductive layer such that an upper surface of the first insulating layer, opposite the substrate, is exposed.

10. The method of claim 9, wherein the second insulating layer is a spin on glass layer.

11. The method of claim 9, wherein forming the insulating spacers comprises:
    forming a third insulating layer on the capping layer, the sidewalls of the second insulating layer, and the etch stop layer; and
    etching the third insulating layer so as to remove at least a portion of the third insulating layer from the second insulating layer and an upper surface of the capping layer, opposite the substrate.

12. The method of claim 11, further comprising:
    removing at least a portion of the etch stop layer from the contact region between the pair of mesa regions.

13. The method of claim 12, further comprising:
    applying a cleaning solution to the integrated circuit device so as to expose the contact region by removing at least a portion of a native oxide layer from the contact region.

14. The method of claim 13, wherein the cleaning solution comprises at least one of hydrofluoric (HF) acid or a mixture of $NH_4OH$, $H_2O_2$, and $H_2O$.

15. The method of claim 9, wherein removing the portion of the conductive layer comprises:
    chemical mechanical polishing the conductive layer such that the upper surface of the first insulating layer, opposite the substrate, is exposed.

16. The method of claim 9, wherein each of the insulating spacers has a width in a range of about 50 Å to about 200 Å.

17. The method of claim 9, wherein the capping layer may comprise at least one of silicon oxide, silicon nitride, undoped polysilicon, doped polysilicon, or $Al_2O_3$.

* * * * *